United States Patent
Li et al.

(10) Patent No.: US 12,211,740 B2
(45) Date of Patent: Jan. 28, 2025

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Shu-Wei Li, Hsinchu (TW); Yu-Chen Chan, Taichung (TW); Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 602 days.

(21) Appl. No.: 17/460,537

(22) Filed: Aug. 30, 2021

(65) Prior Publication Data

US 2023/0062128 A1 Mar. 2, 2023

(51) Int. Cl.
*H01L 21/768* (2006.01)
*H01L 23/522* (2006.01)
*H01L 23/532* (2006.01)

(52) U.S. Cl.
CPC .. *H01L 21/76832* (2013.01); *H01L 21/76843* (2013.01); *H01L 23/5226* (2013.01); *H01L 23/53238* (2013.01); *H01L 23/53276* (2013.01)

(58) Field of Classification Search
CPC ............ H01L 21/76832; H01L 21/76843
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2005/0277292 A1* | 12/2005 | Peng ................. | H01L 21/28562 257/E21.171 |
| 2008/0251922 A1* | 10/2008 | Shih ................... | H01L 21/76849 257/E23.141 |
| 2018/0350666 A1* | 12/2018 | Tung ................... | H01L 23/5329 |
| 2020/0135655 A1* | 4/2020 | Yang ................... | H01L 23/5226 |
| 2021/0082829 A1* | 3/2021 | Yang ................... | H01L 21/76867 |

* cited by examiner

*Primary Examiner* — Walter H Swanson
*Assistant Examiner* — Jacob T Nelson
(74) *Attorney, Agent, or Firm* — NZ CARR LAW OFFICE

(57) ABSTRACT

An interconnect structure and methods of forming the same are described. In some embodiments, the structure includes a first dielectric layer and one or more first conductive features disposed in the first dielectric layer. The one or more first conductive features includes a first metal. The structure further includes a plurality of graphene layers disposed on each of the one or more first conductive features, the plurality of graphene layers include a second metal intercalated therebetween, and the second metal is different from the first metal.

20 Claims, 20 Drawing Sheets

INTERCONNECT STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnect structure gets higher, electrical resistivity increase. Therefore, improved interconnect structures are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
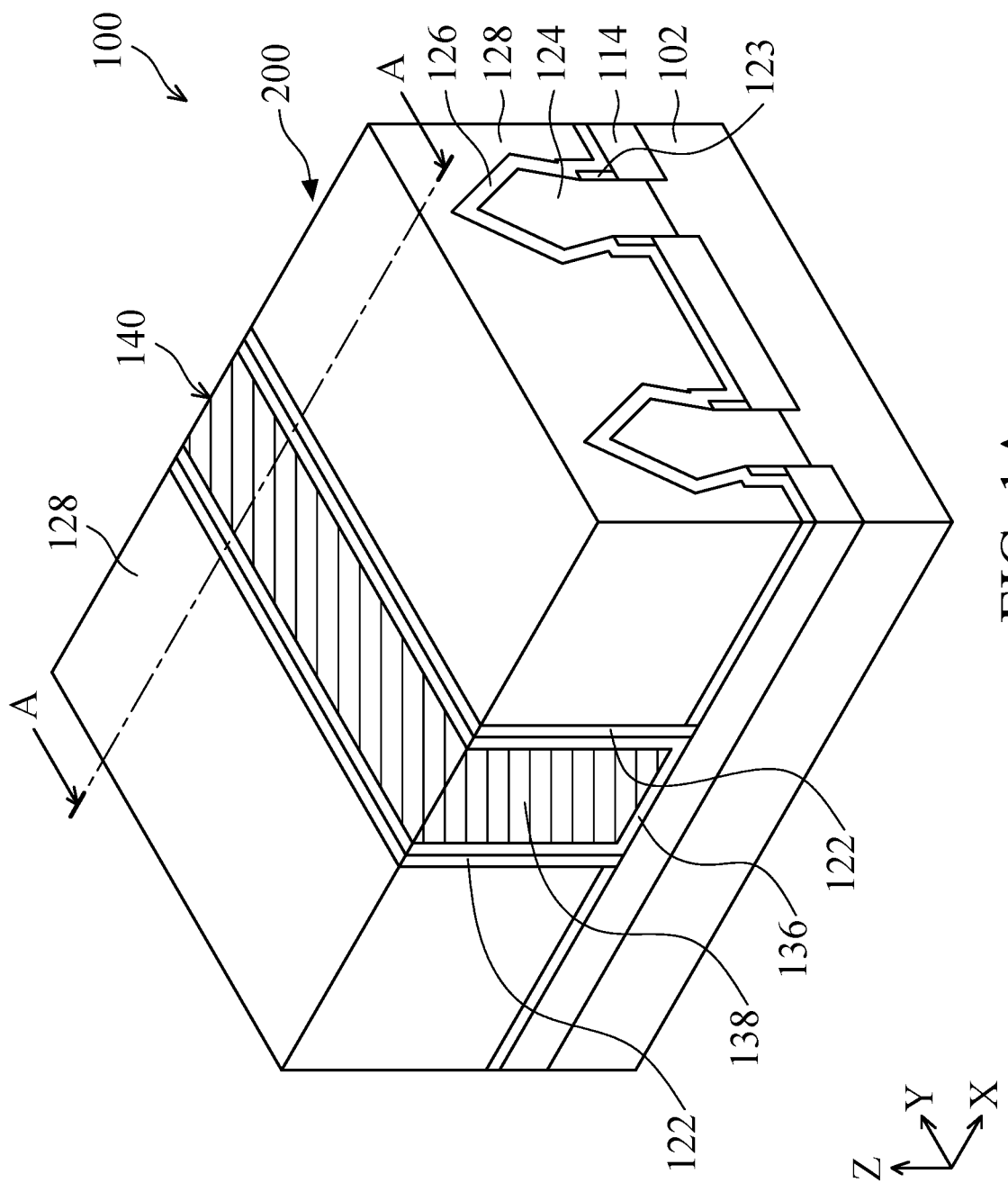
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
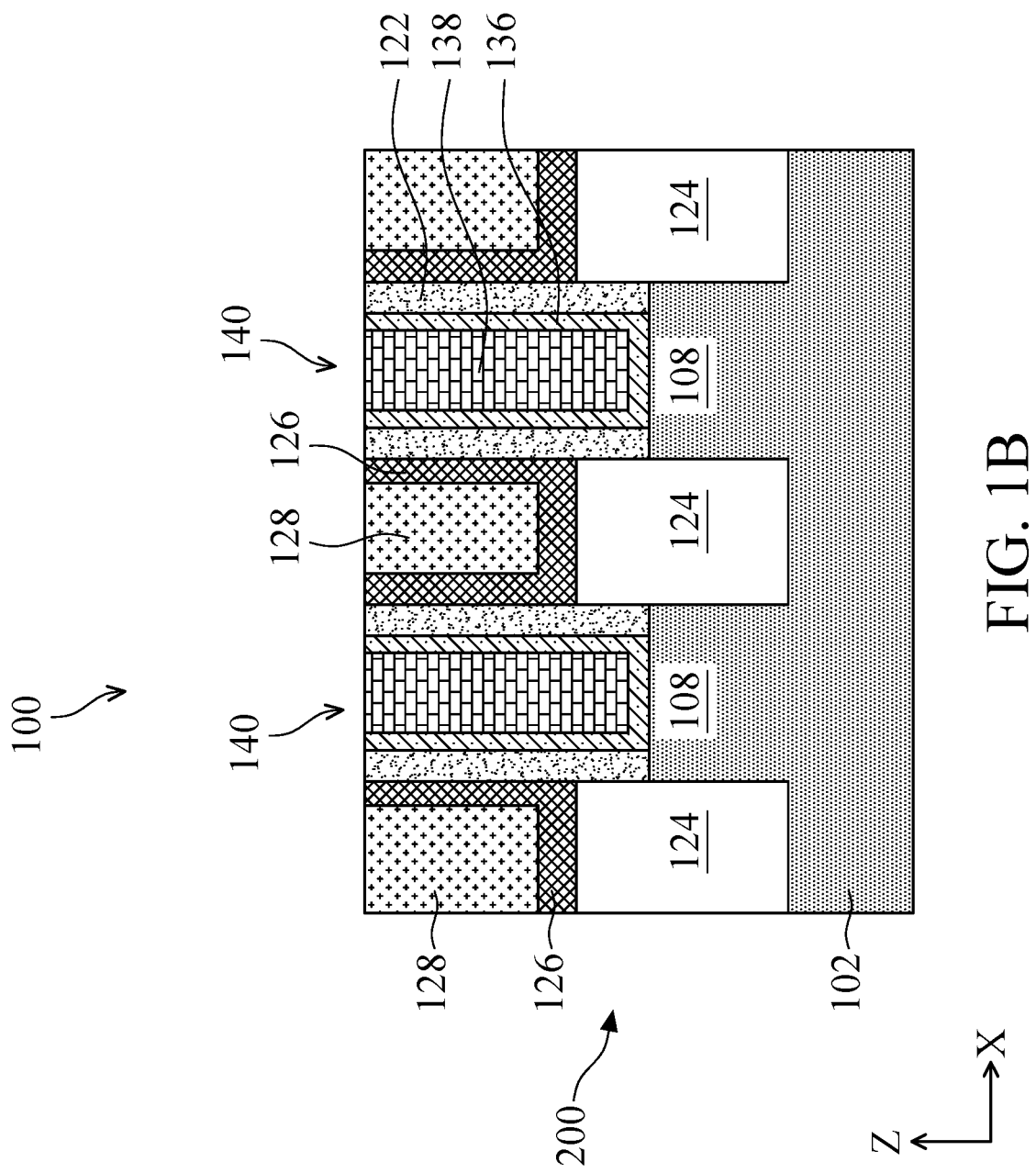
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
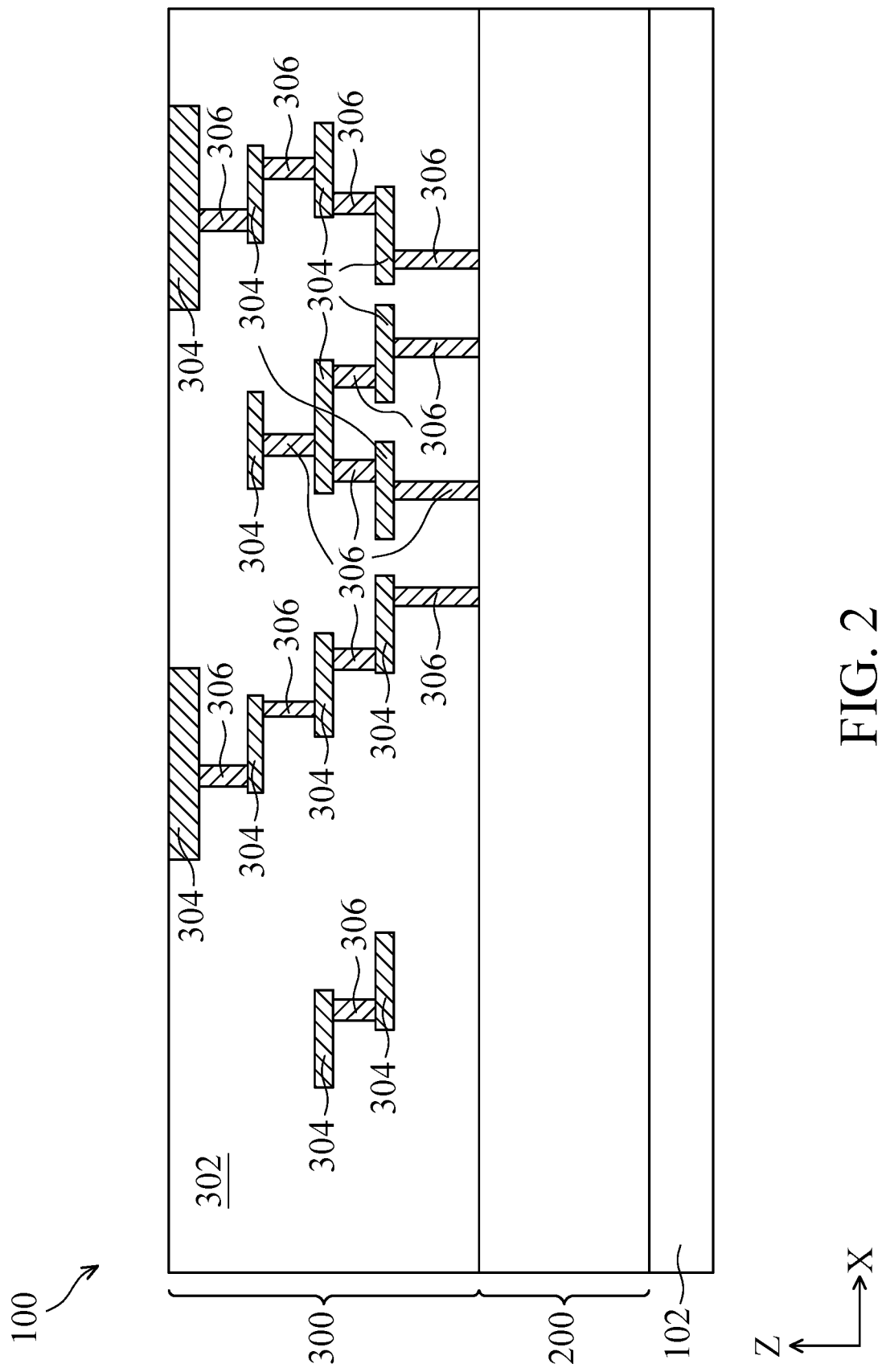
FIG. 2 is a cross-sectional side view of a stage of manufacturing the semiconductor device structure, in accordance with some embodiments.

The semiconductor device structure 100 may further includes an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottom-most conductive features 306 of the interconnection structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

Figure 3A:
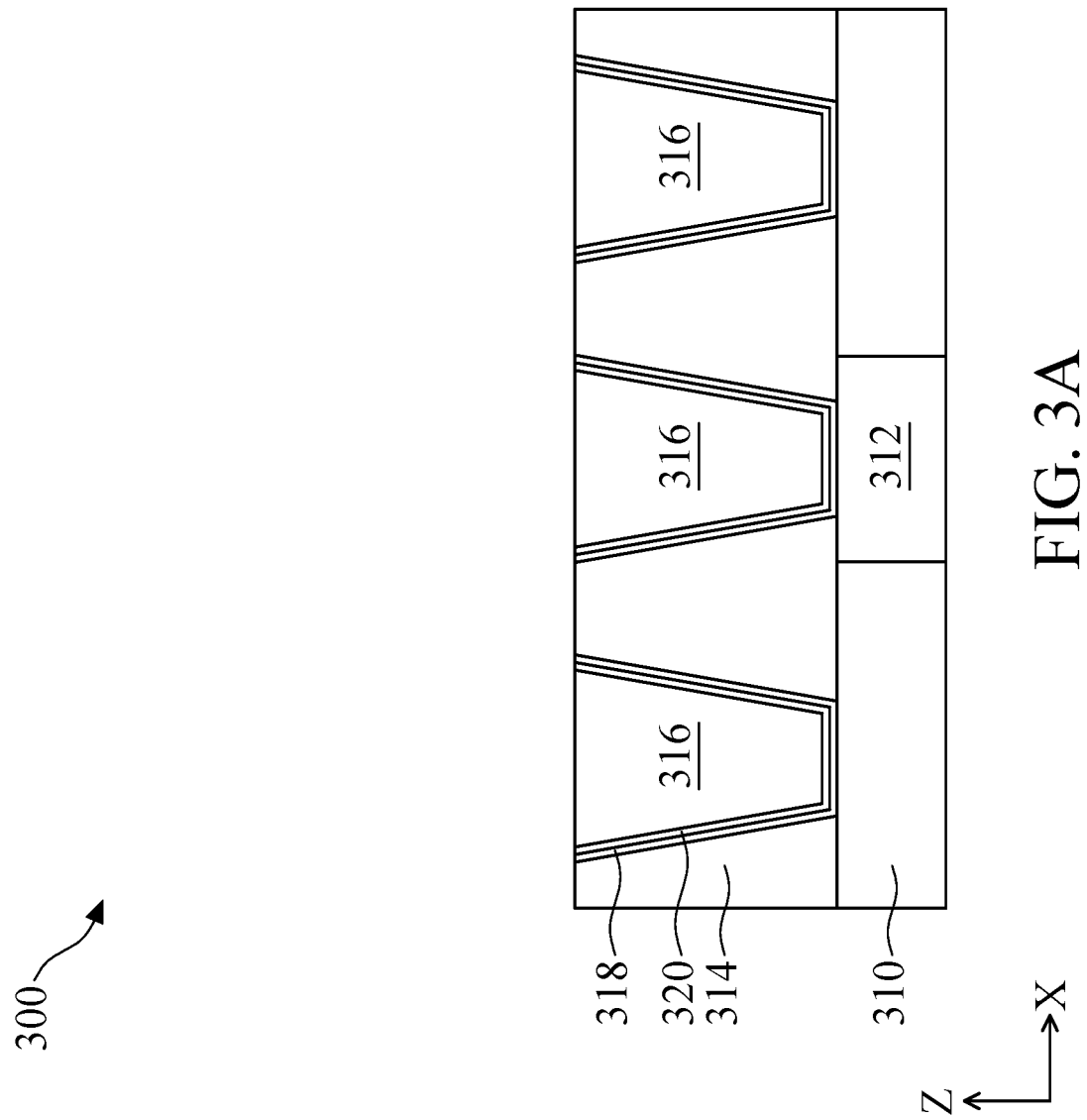
FIGS. 3A-3E are cross-sectional side views of various stages of manufacturing an interconnect structure, in accordance with some embodiments.

FIGS. 3A-3E are cross-sectional side views of various stages of manufacturing an interconnect structure 300, in accordance with some embodiments. As shown in FIG. 3A, the interconnect structure 300 includes a dielectric layer 310, which may be an ILD layer or an IMD layer. For example, the dielectric layer 310 may be the ILD layer 128 (FIGS. 1A and 1B) or the IMD layer 302 (FIG. 2). The dielectric layer 310 may include the same material as the ILD layer 128 or the IMD layer 302. In some embodiments, the dielectric layer 310 includes a low-k dielectric material having a k value ranging from about 1.5 to about 3.9. In some embodiments the low-k dielectric material includes SiOCH. The dielectric layer 310 may be formed by CVD, FCVD, ALD, spin coating, or other suitable process. The dielectric layer 310 includes one or more conductive features 312 (only one is shown) disposed in the dielectric layer 310. The conductive feature 312 includes an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 312 includes a metal. The conductive feature 312 may be formed by PVD, CVD, ALD, or other suitable process. In some embodiments, the conductive feature 312 may be the conductive contact disposed in the ILD layer 128 or the conductive feature 304 or 306 disposed in the IMD layer 302. In some embodiments, the conductive feature 312 includes a barrier layer (not shown) disposed between the dielectric layer 310 and the electrically conductive material of the conductive feature 312. The barrier layer may include an electrically conductive material, such as a metal or metal nitride.

A dielectric layer 314 is disposed on the dielectric layer 310. The dielectric layer 314 may include the same material as the dielectric layer 310 and may be formed by the same process as the dielectric layer 310. One or more conductive features 316 are formed in the dielectric layer 314. The conductive feature 316 includes an electrically conductive material, such as Cu, Co, Ru, Mo, W, Ni, Ti, Zr, Ta, Zn, alloys thereof, or other suitable material. The conductive feature 316 is formed by any suitable process, such as ECP, electroless deposition (ELD), PVD, or CVD. The conductive feature 316 may be the conductive feature 304. In some embodiments, a barrier layer 318 may be formed between the dielectric layer 314 and the conductive feature 316, and a liner 320 may be formed between the barrier layer 318 and the conductive feature 306. The barrier layer 318 and the liner 320 may be formed by any suitable process, such as CVD, PECVD, or ALD. In some embodiments, the barrier layer 318 and the liner 320 are conformal layers formed by ALD. The barrier layer 318 may include Ta, Ti, Mn, Zn, In, TaN, TiN, or other suitable material. In some embodiments, the conductive feature 316 includes a metal that is susceptible to diffusion, such as Cu, and the barrier layer 318 may prevent metal diffusion from the conductive feature 316 to the dielectric layer 314. The liner 320 may function as a glue layer, so both the conductive feature 316 and the barrier layer 318 are adhered to the liner 320. The liner includes a metal, such as Co. In some embodiments, the conductive feature 316 includes a metal that is not susceptible to diffusion, such as Co, and the barrier layer 318 and the liner 320 may be omitted. In some embodiments, the conductive features 316 located near the top of the interconnect structure 300 do not include the liner 320, while the conductive features 316 located near the bottom of the interconnect structure 300 include the liner 320.

Figure 3B:
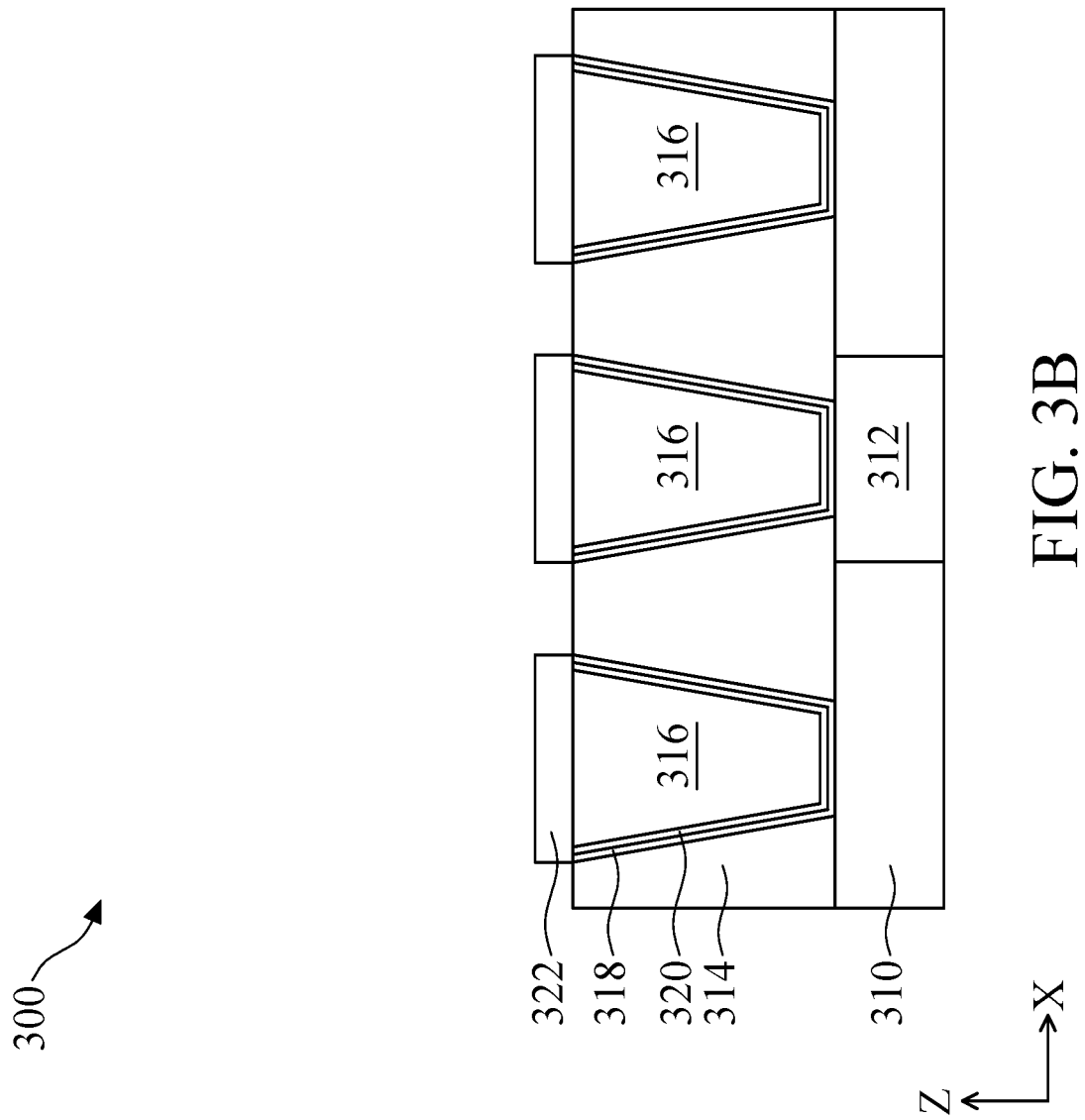

As shown in FIG. 3B, a metal layer 322 is selectively formed on each conductive feature 316. In some embodiments, the barrier layer 318 and the liner 320 include metals, and the metal layer 322 is also formed on the barrier layer 318 and the liner 320, as shown in FIG. 3B. The metal layer 322 includes a metal having relatively higher carbon solubility than the material of the conductive feature 316. In some embodiments, the metal layer 322 includes Ni, Co, W, Mo, Ru, and the conductive feature 316 includes Cu. The metal layer 322 is selectively formed on the metallic surfaces of the conductive feature 316, the barrier layer 318, and the liner 320, and is not formed on the dielectric surfaces of the dielectric layer 314. For example, the exposed surfaces of the dielectric layer 314 may be first treated with a gas containing hydrophobic functional groups, and the hydrophobic functional groups are formed on the exposed surfaces of the dielectric layer 314. The gas containing hydrophobic functional groups does not react with the metallic surfaces of the barrier layers 318, the liners 320, and the conductive features 316. The hydrophobic functional groups formed on the exposed surfaces of the dielectric layer 314 block the metal layer 322 from forming on the dielectric layer 314.

Figure 3C:
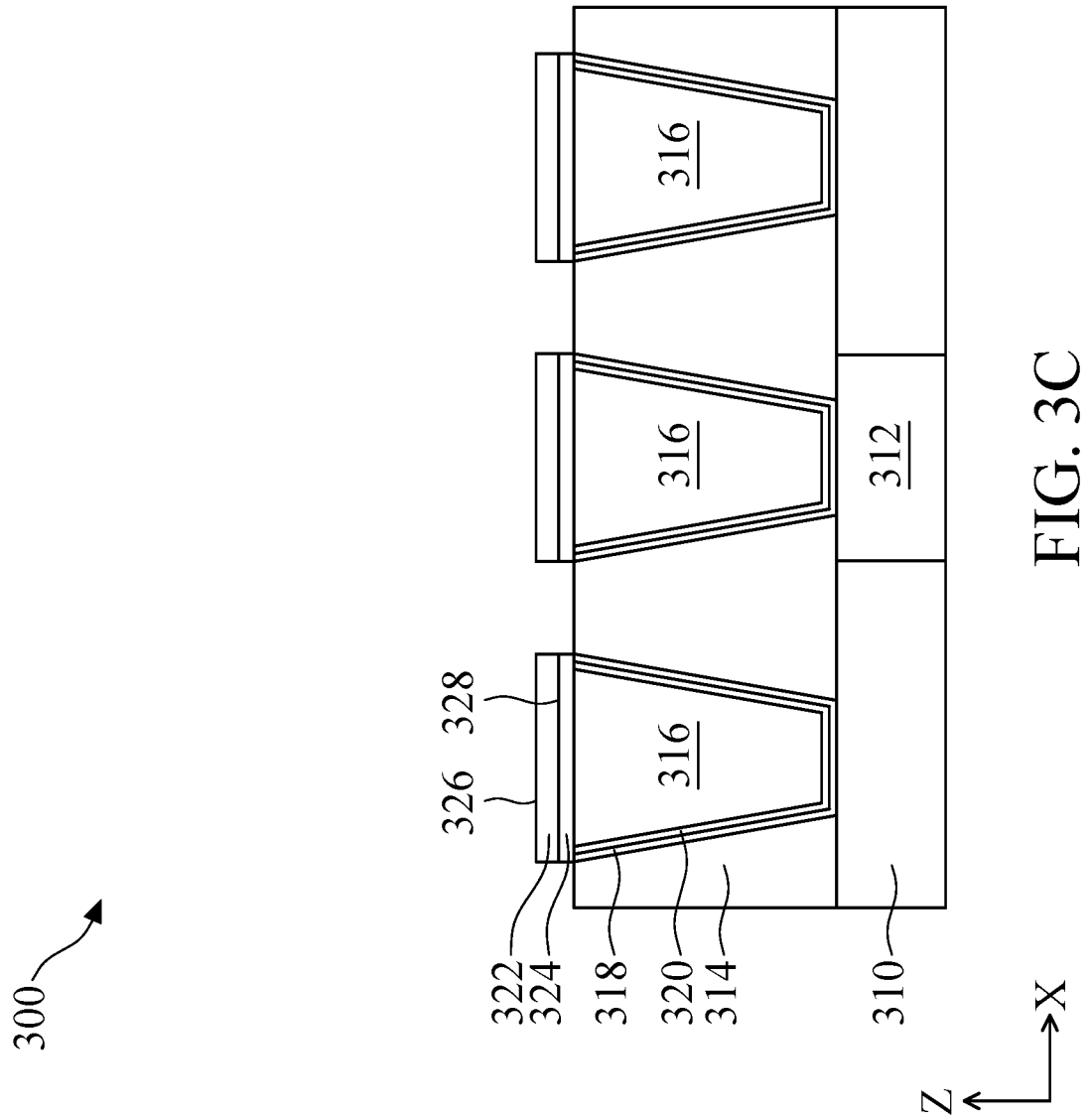

As shown in FIG. 3C, a carbon-containing layer 324 is formed between the metal layer 322 and the conductive feature 316. The carbon-containing layer 324 includes one or more layers of graphene, such as 1 to 1000 layers of graphene. The carbon-containing layer 324 may be formed by a thermal or plasma assisted CVD process. For example, in some embodiments, the carbon-containing layer 324 may be formed by introducing a carbon-containing precursor into a processing chamber and applying energy to the carbon-containing precursor to form a plasma including carbon-containing species. The energy may be from a power source, such as microwave, inductively-coupled plasma (ICP), or electron cyclotron resonance (ECR) power sources. The processing temperature ranges from about 0 degrees Celsius to about 450 degrees Celsius, such as from about 400 degrees Celsius to about 450 degrees Celsius. The processing pressure ranges from about 1 Torr to about 4000 Torr. The carbon-containing precursor may be any suitable carbon-containing material, such as a carbon-containing gas, a carbon-containing liquid, or a carbon-containing solid. In some embodiments, the carbon-containing precursor includes $CH_4$, $C_2H_2$, benzene or other suitable carbon-containing materials. The metal layers 322 cover the conductive features 316 during the formation of the carbon-containing layers 324. For example, the top surfaces of the conductive features 316 are not exposed during the formation of the carbon-containing layers 324. The carbon-containing layers 324 has a higher electrical conductivity compared to that of the conductive features 316. As a result, electrical resistivity of the conductive features 316 is decreased.

The carbon-containing species diffuses through the metal layer 322 and forms the carbon-containing layer 324 on the conductive feature 316, the barrier layer 318, and the liner 320. As described above, the metal layer 322 includes a material having relatively higher carbon solubility than the materials of the conductive feature 316, the barrier layer 318, and the liner 320. As a result, the carbon-containing species do not diffuse into the conductive feature 316, the barrier layer 318, and the liner 320. Furthermore, the metal layers 322 includes carbon as a result of the diffusion of carbon-containing species therethrough. The carbon-containing species diffuses through the metal layers 322 from the top surface 326 to the bottom surface 328 via the grain boundaries of the metal layers 322. Thus, the carbon may be disposed along the grain boundaries of the metal layers 322, and the amount of carbon located in the metal layers 322 may have a gradient that decreases from a top surface 326 to a bottom surface 328. In addition, the carbon-containing layers 324 may include metal atoms from the metal layers 322 intercalated therein due to the low carbon solubility of the metal layers 322, and the metal atoms in the carbon-containing layers 324 are different from the material of the conductive features 316. For example, the carbon-containing layers 324 are a plurality of graphene layers, such as 3 to 1000 graphene layers, having metal atoms intercalated between the graphene layers, and the metal atoms are different from the metal of the conductive feature 316.

Figure 3D:
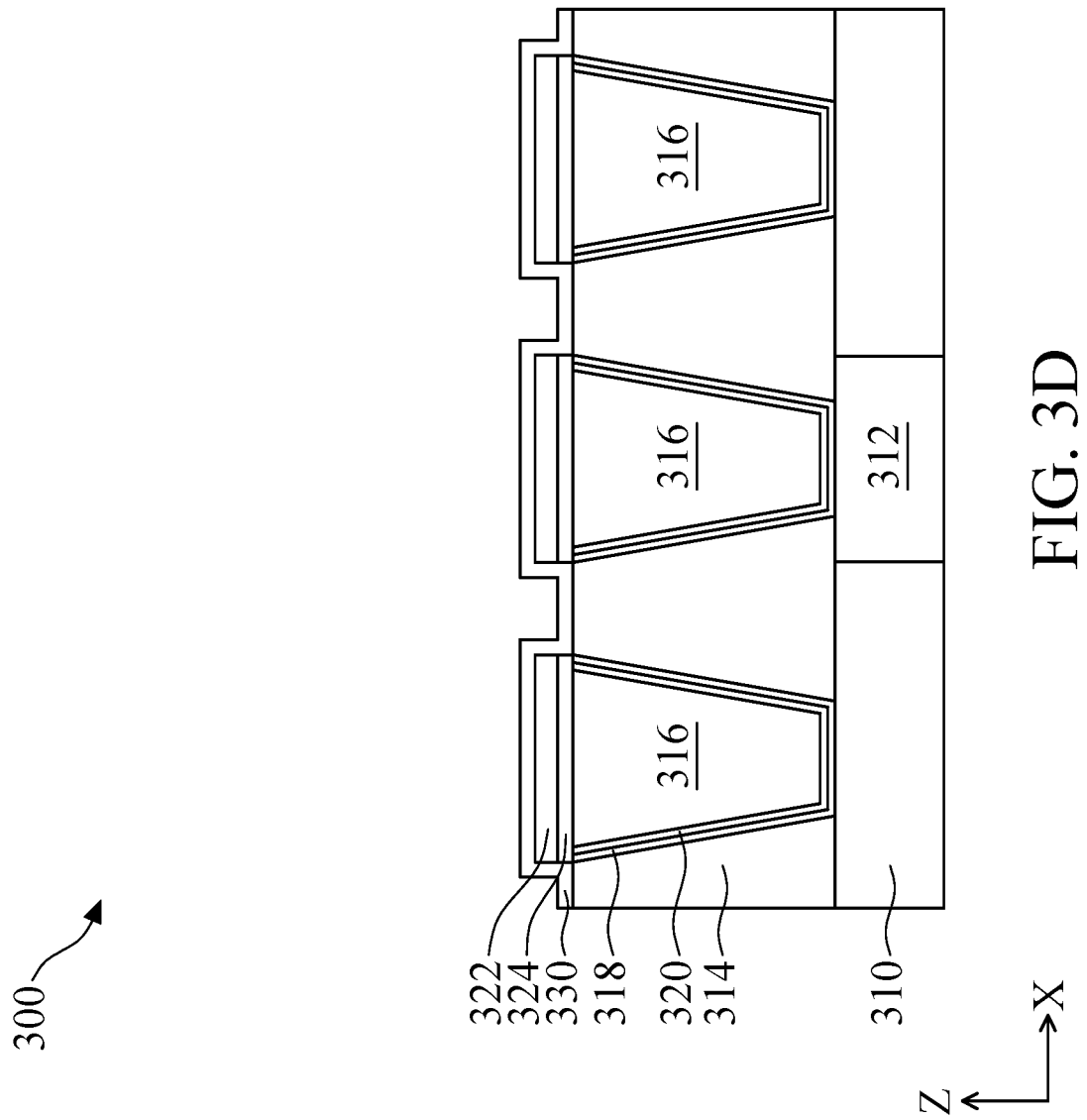

As shown in FIG. 3D, an etch stop layer 330 is formed on the dielectric layer 314, the metal layers 322, and the side surfaces of the metal layers 322 and the carbon-containing layers 324. The etch stop layer 330 may include an oxide or a nitride of a metal, such as Al, Ti, Zr, Hf, Y, or other suitable metal. In some embodiments, the etch stop layer 330 includes an oxide or a nitride of a semiconductor, such as silicon. The etch stop layer 330 may be formed by any suitable process, such as CVD or ALD.

Figure 3E:
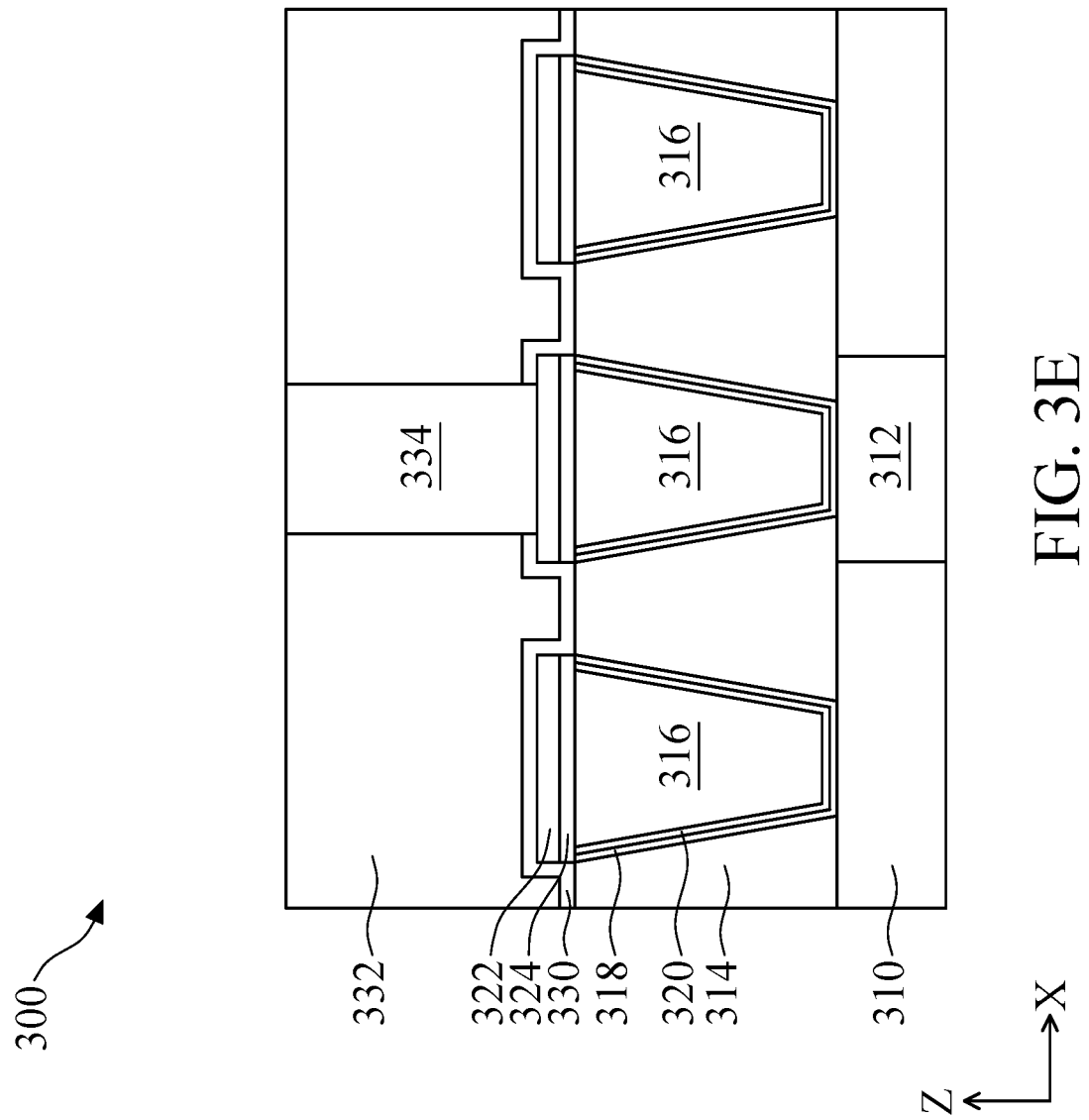

As shown in FIG. 3E, a dielectric layer 332 is formed on the etch stop layer 330. In some embodiments, the dielectric layer 332 includes the same material as the dielectric layer 314 and is formed by the same process as the dielectric layer 314. One or more conductive features 334 (only one is shown) is formed in the dielectric layer 332. The conductive feature 334 may include the same material as the conductive feature 312 and may be formed by the same process as the conductive feature 312. In some embodiments, the conductive feature 334 includes a barrier layer (not shown) disposed between the dielectric layer 332 and the electrically conductive material of the conductive feature 334. The barrier layer may include an electrically conductive material, such as a metal or metal nitride. As shown in FIG. 3E, the conductive feature 334 is in contact with the metal layer 322. Because the carbon-containing layer 324 and the metal layer 322 are both electrically conductive, the conductive feature 334 is electrically connected to one of the conductive features 316.

Figure 4A:
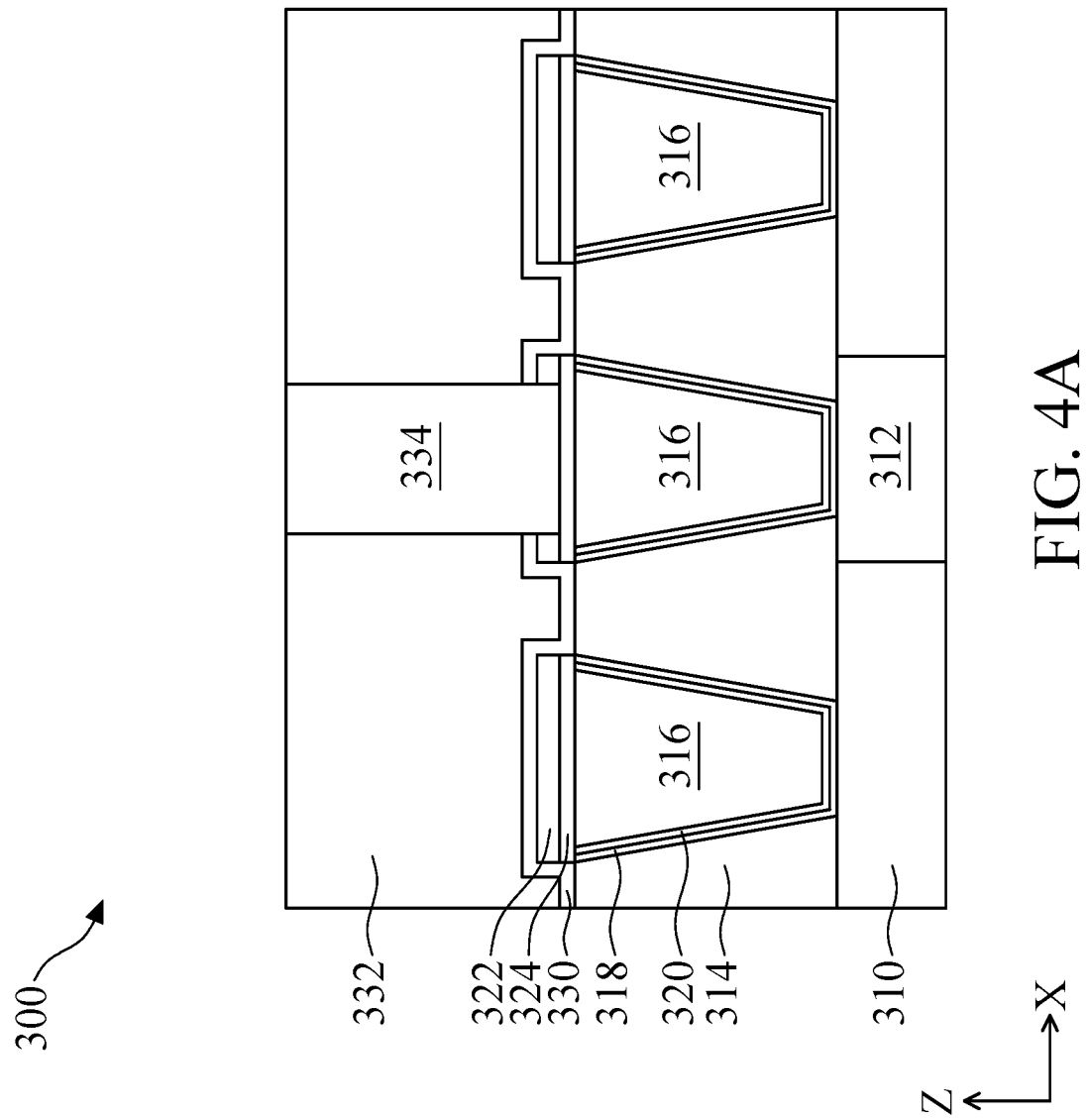
FIGS. 4A-4B are cross-sectional side views of one of various stages of manufacturing the interconnect structure, in accordance with alternative embodiments.
Figure 4B:
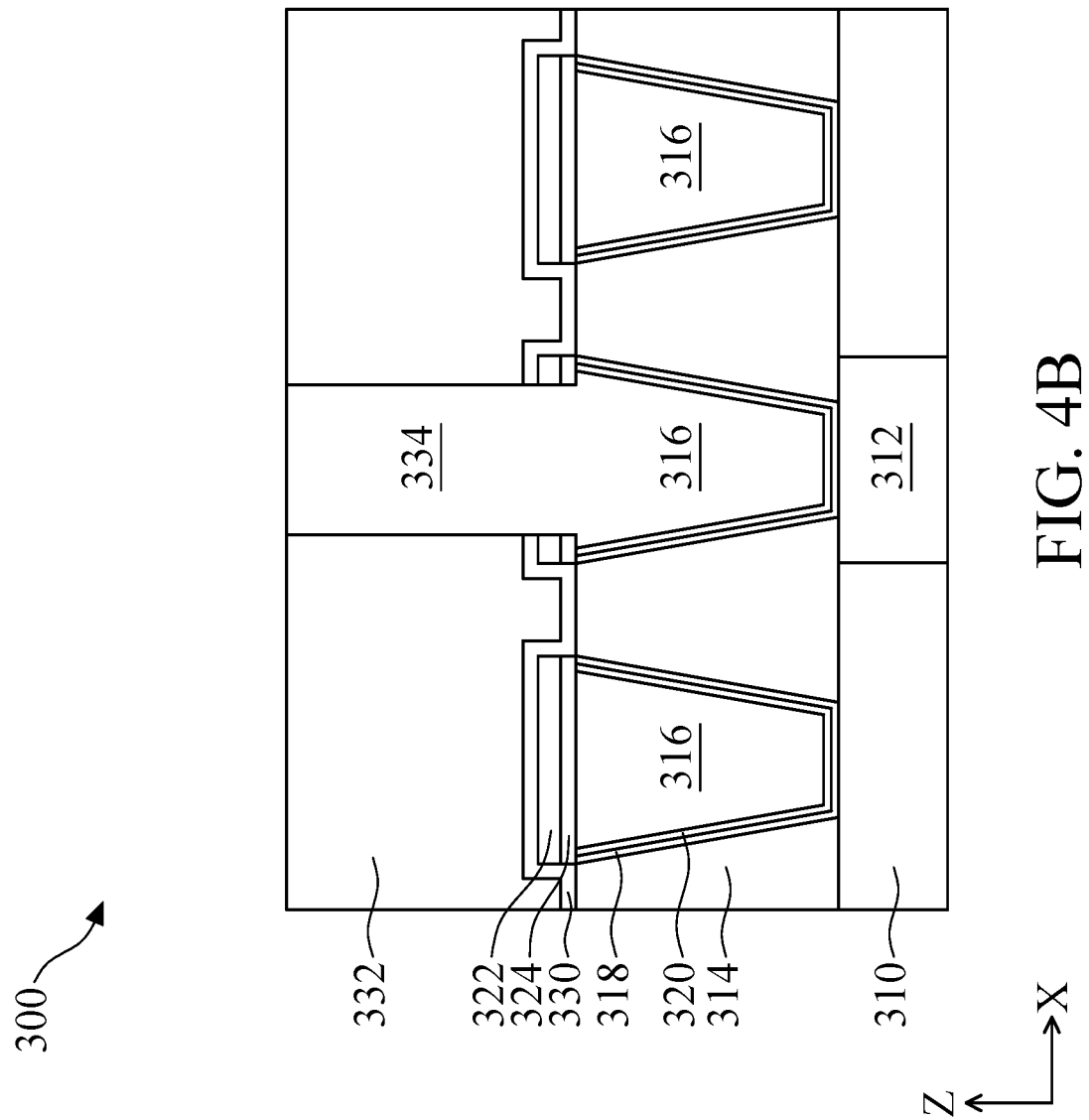

FIGS. 4A-4B are cross-sectional side views of one of various stages of manufacturing the interconnect structure 300, in accordance with alternative embodiments. In some embodiments, as shown in FIG. 4A, the conductive feature 334 is disposed through the metal layer 322 and in contact with the carbon-containing layer 324. A portion of the metal layer 322 may be removed to expose a portion of the carbon-containing layer 324, and the conductive feature 334 is formed on the exposed portion of the carbon-containing layer 324. The conductive feature 334 being in direct contact with the carbon-containing layer 324 may have a lower electrical resistance compared to the embodiment shown in FIG. 3E, because the metal layer 322 may have an increased electrically resistivity due to the inclusion of carbon. As shown in FIG. 4B, in some embodiments, the conductive feature 334 is disposed through the metal layer 322 and the carbon-containing layer 324 and in contact with the conductive feature 316. A portion of the metal layer 322 and a portion of the carbon-containing layer 324 may be removed to expose a portion of the conductive feature 316, and the conductive feature 334 is formed on the exposed portion of the conductive feature 316. The conductive feature 334 being in direct contact with the conductive feature 316 may have the lowest electrical resistance, compared to the embodiments shown in FIGS. 3E and 4A due to direct metal to metal contact.

Figure 5A:
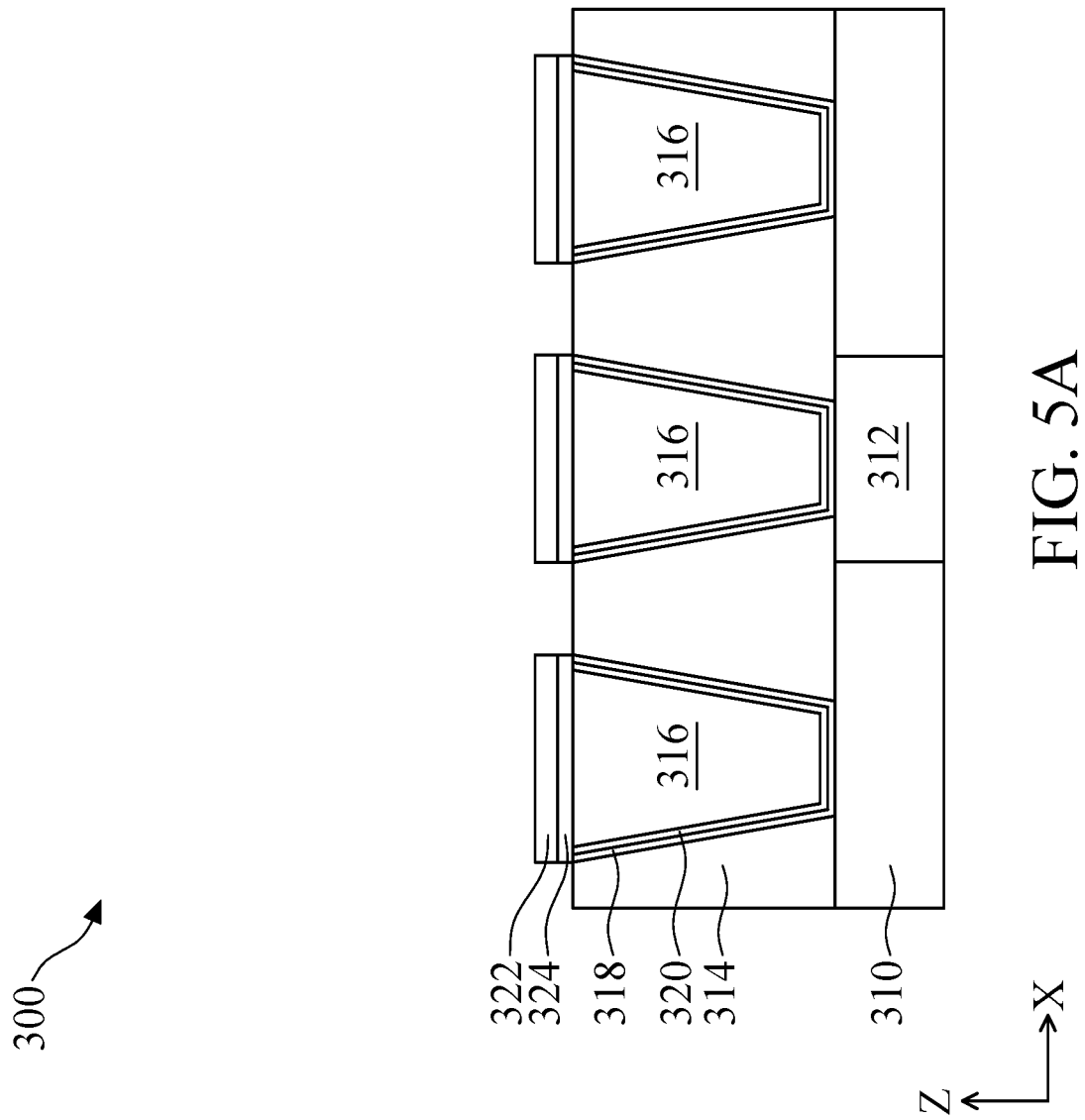
FIGS. 5A-5C are cross-sectional side views of various stages of manufacturing the interconnect structure, in accordance with alternative embodiments.
Figure 5B:
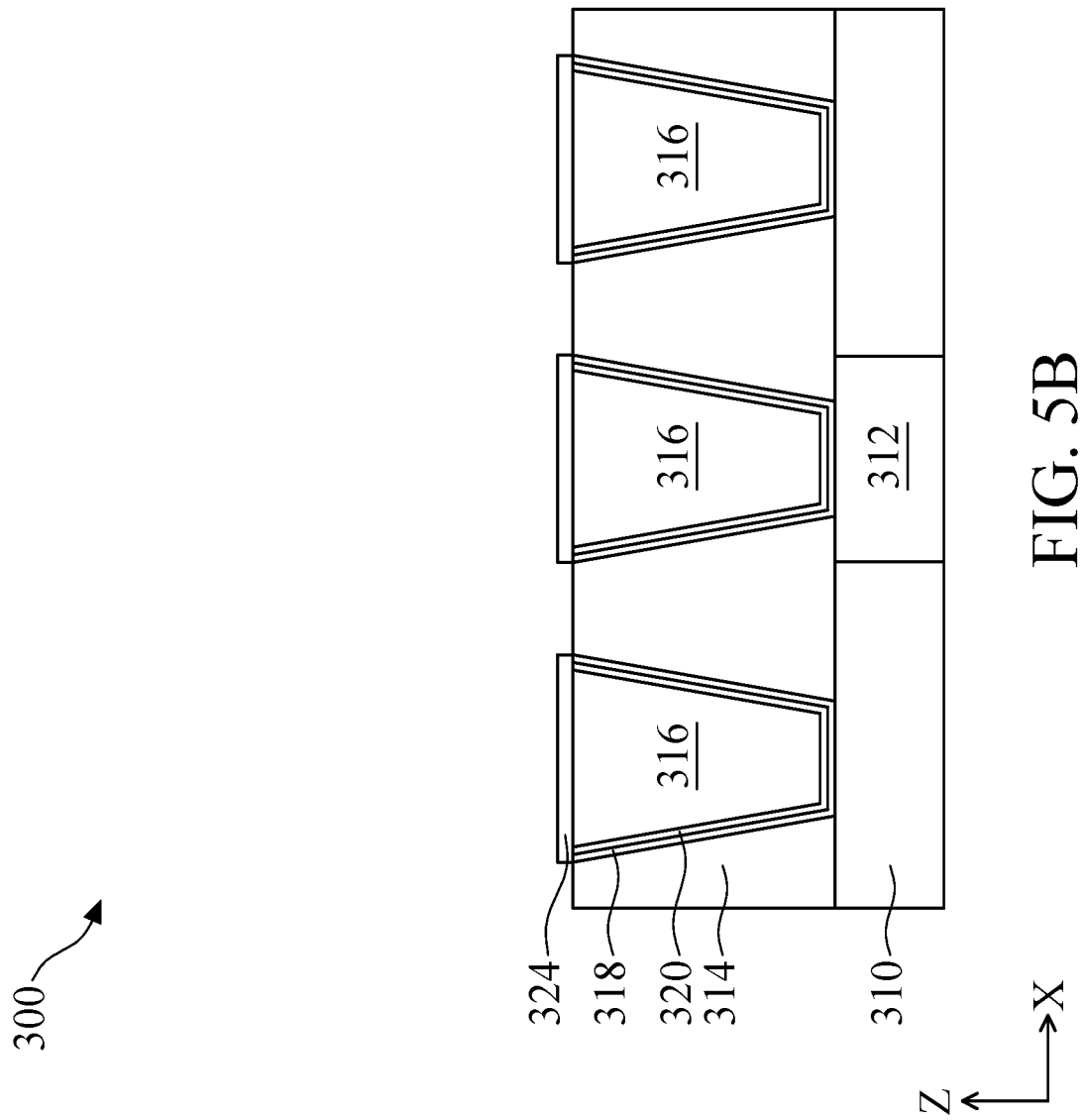
Figure 5C:
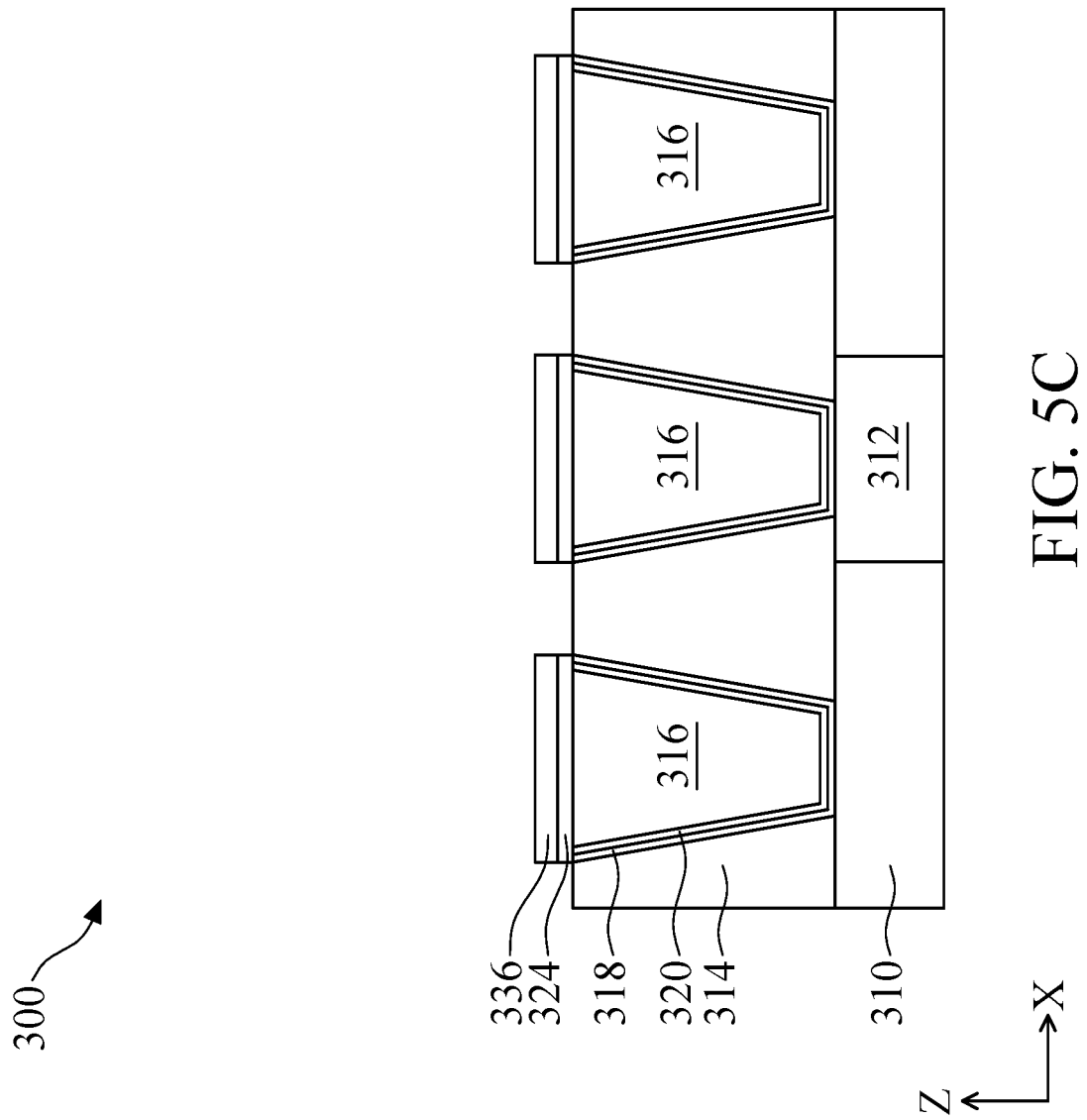

FIGS. 5A-5C are cross-sectional side views of various stages of manufacturing the interconnect structure 300, in accordance with alternative embodiments. The interconnect structure 300 shown in FIG. 5A is at the same manufacturing stage as the interconnect structure 300 shown in FIG. 3C. Instead of forming the etch stop layer 330 on the dielectric layer and the metal layers 322, the metal layers 322 are removed, as shown in FIG. 5B. The metal layers 322 may be removed by any suitable process, such as a wet etch process. In some embodiments, acetic acid solution is used in the wet etch process to remove the metal layers 322 but not substantially affect the dielectric layer 314 and the carbon-containing layer 324. In some embodiments, after the removal of the metal layers 322, processes described in FIGS. 3D and 4A or 4B may be performed. For example, the etch stop layer 330 is formed on the carbon-containing layer 324 and the dielectric layer 314, the dielectric layer 332 is formed on the etch stop layer 330, and the conductive feature 334 is formed in the dielectric layer 332. The conductive feature 334 may be in contact with the carbon-containing layer 324 or the conductive feature 316.

In some embodiments, after removing the metal layers 322 and prior to forming the etch stop layer 330, metal layers 336 are selectively formed on the carbon-containing layers 324, as shown in FIG. 5C. Unlike the metal layers 322, which has increased electrical resistivity due to the inclusion of carbon, the metal layers 336 do not include carbon and have lower electrical resistivity compared to the metal layers 322. The metal layer 336 includes Co, Cu, Ni, Ru, W, Mo, Ti, Zr, Ta, Zn, or other suitable metal. In some embodiments, the metal layer 336 includes the same material as the conductive feature 316. The metal layers 336 are selectively formed on the carbon-containing layers 324 and not on the dielectric layer 314. In some embodiments, a plasma treatment is first performed on the carbon-containing layers 324 to activate the surfaces of the carbon-containing layers 324. The gas used in the plasma treatment includes $N_2$, $NH_3$, or $H_2$. The precursors of the metal layers 336 attach to the activated surfaces of the carbon-containing layers 324 but not to the dielectric layer 314. The metal layers 336 may be selectively formed by any suitable process, such as ALD, CVD, ELD, or ECP.

In some embodiments, after forming the metal layers 336, processes described in FIGS. 3D and 3E, 4A or 4B may be performed. For example, the etch stop layer 330 is formed on the metal layers 336 and the dielectric layer 314, the dielectric layer 332 is formed on the etch stop layer 330, and the conductive feature 334 is formed in the dielectric layer 332. The conductive feature 334 may be in contact with the metal layer 336, the carbon-containing layer 324, or the conductive feature 316.

Figure 6A:
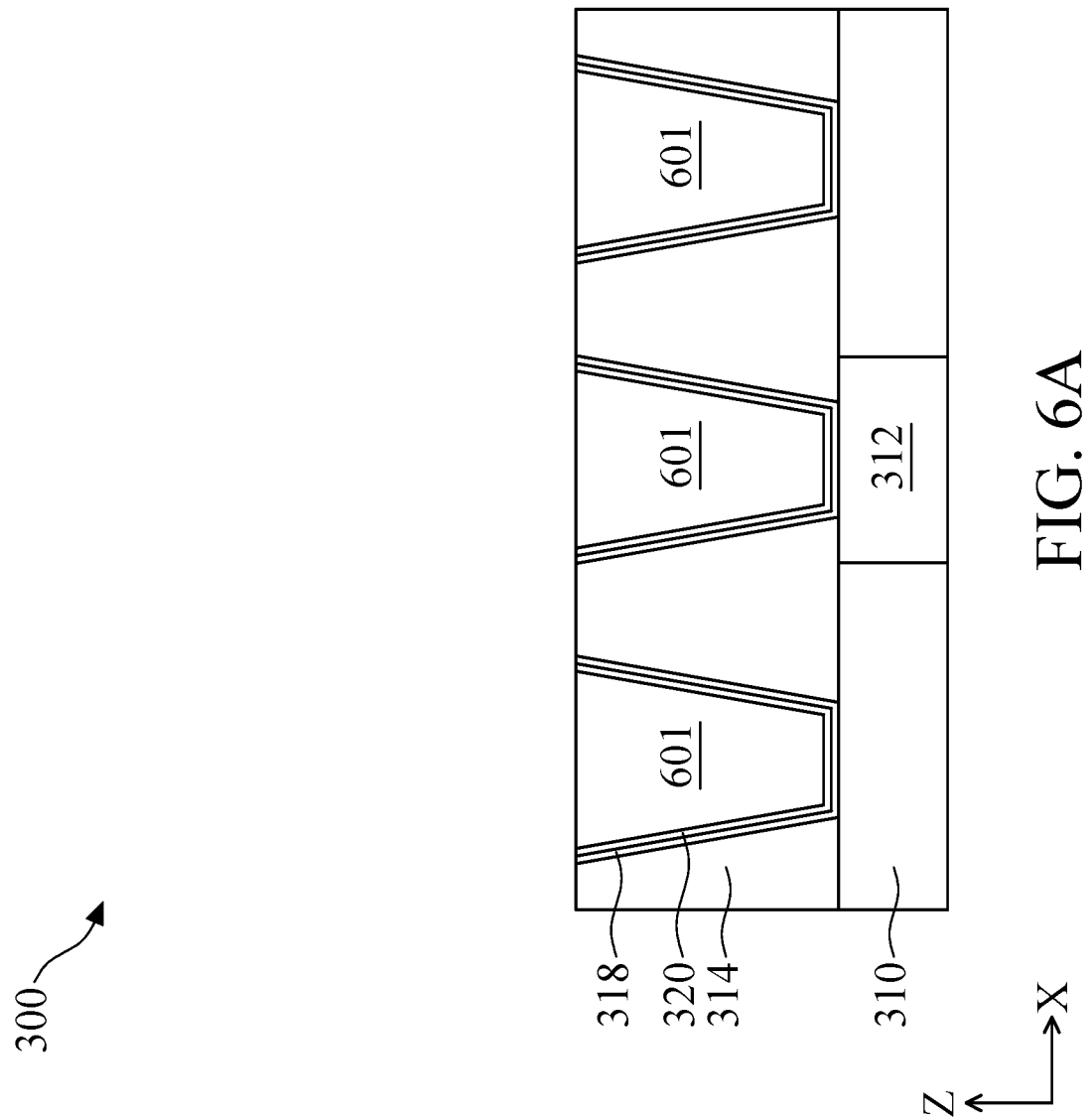
FIGS. 6A-6F are cross-sectional side views of various stages of manufacturing an interconnect structure, in accordance with some embodiments.

FIGS. 6A-6F are cross-sectional side views of various stages of manufacturing the interconnect structure 300, in accordance with some embodiments. As shown in FIG. 6A, conductive features 601 are formed in the dielectric layer 314. Unlike the conductive features 316, which are made of a material having relatively low carbon solubility, the conductive features 601 includes a material having relatively high carbon solubility. In some embodiments, the conductive feature 601 includes the same material as the metal layer 322. In some embodiments, the conductive feature 601 includes a metal that is susceptible to diffusion, and the barrier layer 318 and the liner 320 are formed between the conductive feature 601 and the dielectric layer 314 in order to prevent diffusion of metal into the dielectric layer 314 and to adhere the conductive feature 601 to the barrier layer 318. In some embodiments, the conductive feature 601 includes a metal that is not susceptible to diffusion, and the barrier layer 318 and the liner 320 may be omitted.

Figure 6B:
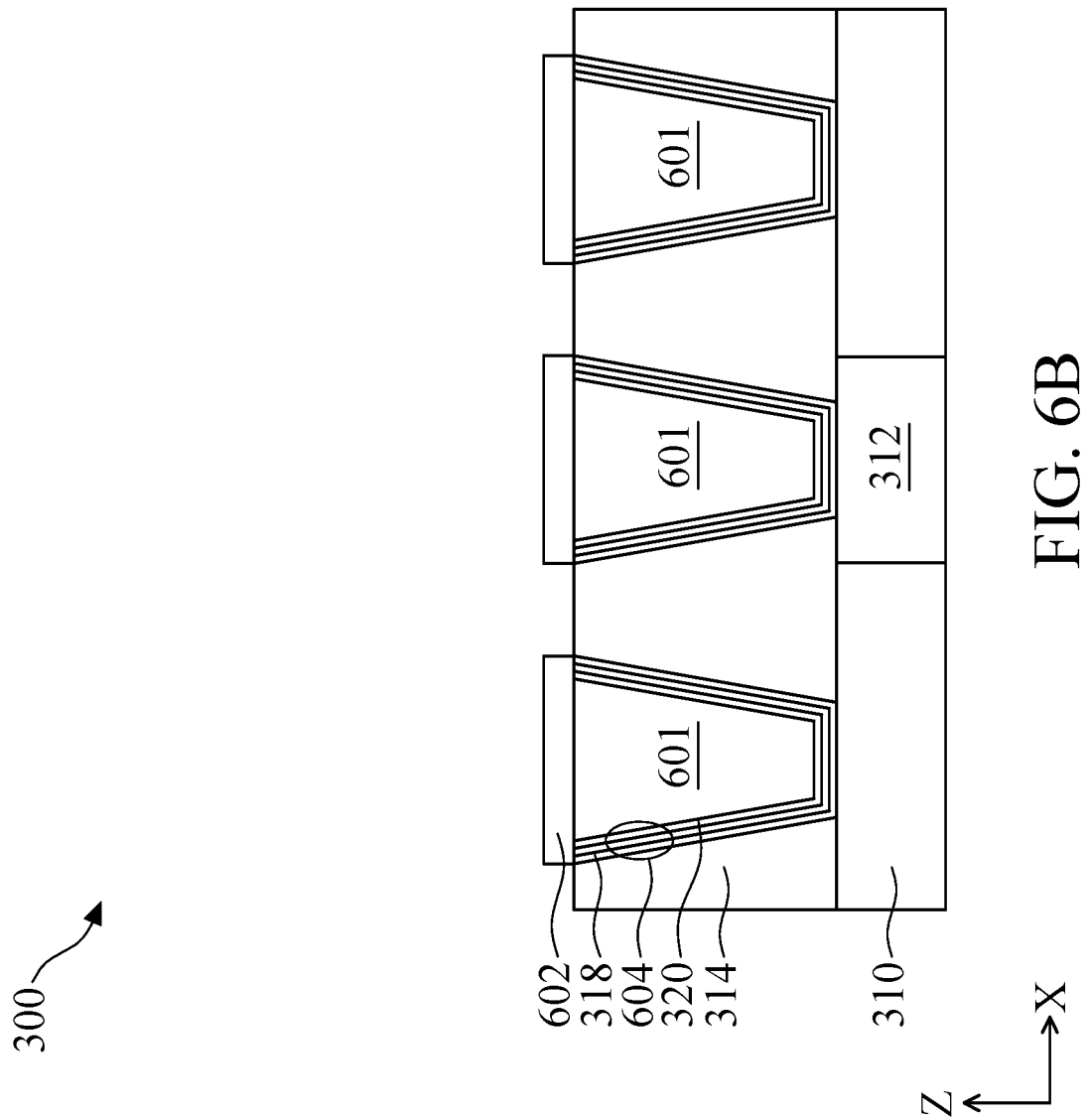
Figure 6C:
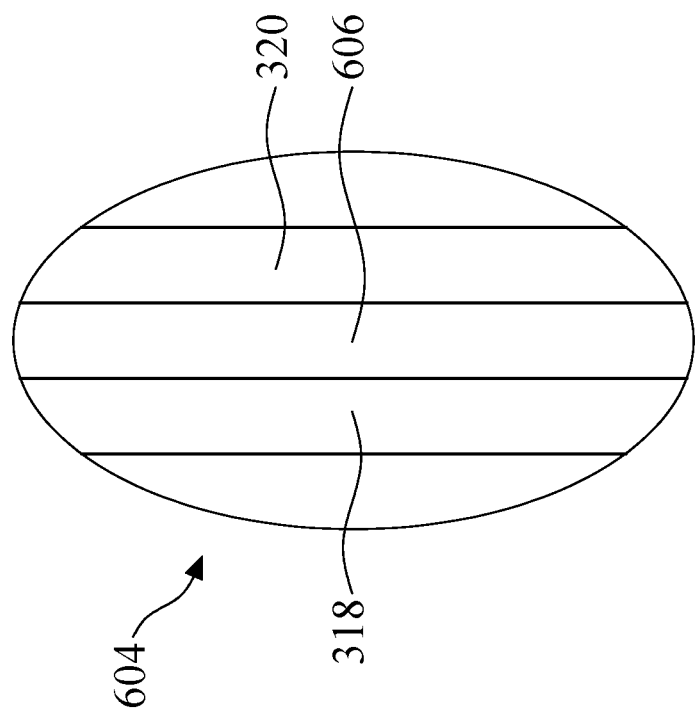
Figure 6D:
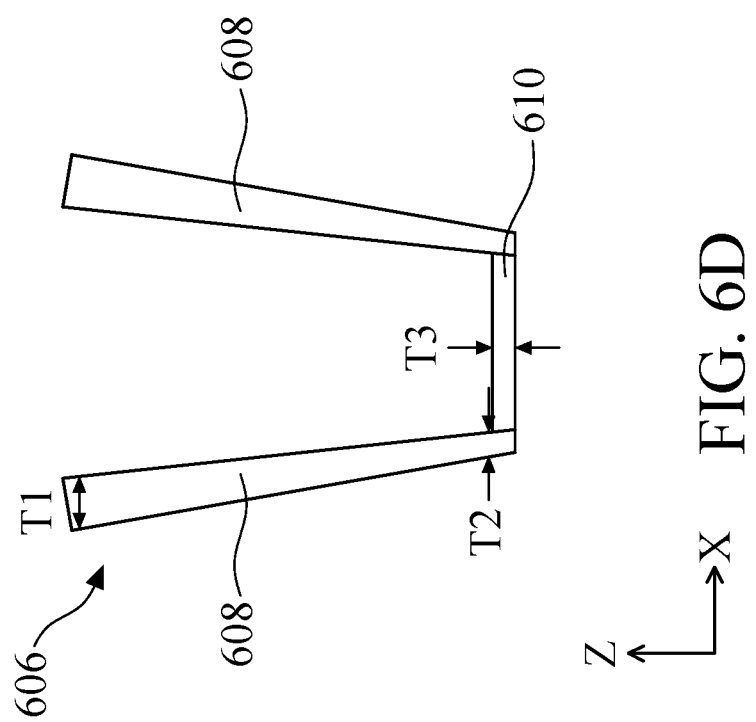

As shown in FIG. 6B, a carbon-containing layer 602 is formed on each conductive feature 601. The carbon-containing layer 602 may include the same material as the carbon-containing layer 324 and may be formed by the same process as the carbon-containing layer 324. Because the conductive features 601 includes a material having high carbon solubility, the carbon species diffuse into the conductive feature 601 as the carbon-containing layers 602 are formed. In some embodiments, the liner 320 is also made of a material having high carbon solubility, and the carbon species diffuse into and through the liner 320. The barrier layer 318 includes a material having low carbon solubility. As a result, as shown in FIG. 6C, which is an enlarged portion 604 shown in FIG. 6B, a carbon-containing layer 606 is formed between the barrier layer 318 and the liner 320. The carbon-containing layer 606 may include one or more layers of graphene. Because the carbon species are diffused into the conductive features 601 from the top surfaces of the conductive features 601, the carbon-containing layers 606 formed between the liner 320 and the barrier layer 318 may have a decreasing thickness along the x-axis in a direction from the carbon-containing layer 602 to the dielectric layer 310. For example, as shown in FIG. 6D, which is a cross-sectional side view of the carbon-containing layer 606, each carbon-containing layer 606 formed between the liner 320 and the barrier layer 318 has a first thickness T1 along the x-axis adjacent the carbon-containing layer 602 and a second thickness T2 along the x-axis adjacent the portion of the barrier layer 318 disposed on the dielectric layer 310. The first thickness T1 is substantially greater than the second thickness T2. In some embodiments, each carbon-containing layer 602 has a third thickness T3 along the z-axis between the portion of the barrier layer 318 disposed on the dielectric layer 310 and the portion of the liner 320 disposed over the portion of the barrier layer 318. In other words, in some embodiments, as shown in FIG. 6D, each carbon-containing layer 606 includes a "U" shaped cross-section profile, such as two slant portions 608 connected by a horizontal portion 610. Each slant portion 608 has the first thickness T1 at the top of the slant portion 608 and the second thickness T2 at the bottom of the slant portion 608. The horizontal portion 610 has a third thickness T3. The first thickness T1 is substantially greater than the second thickness T2, which is substantially greater than the third thickness T3. The carbon concentration in the conductive feature 601 also decreases from the top to the bottom due to the carbon species being diffused from the top to the bottom of the conductive feature 601.

In some embodiments, the carbon-containing layer 606 includes the materials from the conductive feature 601 and the liner 320. For example, the carbon-containing layer 606 includes two different metals, such as Ni, Co, W, Mo, or Ru, and one of the metals is the same as the conductive feature 601 while the other of the metals is the same as the liner 320. In some embodiments, the carbon-containing layer 606 includes a plurality of graphene layers having two different metals intercalated therebetween.

In some embodiments, the conductive features 601 include a material having low carbon solubility, such as the material of the conductive features 316, for example copper. The carbon-containing layer 606 may be formed by diffusing through the liner 320. In some embodiments, the conductive features 601 include a material having high carbon solubility, while the liners 320 and the barriers 318 include materials having low carbon solubility, and the carbon-containing layers 606 are formed between each conductive feature 601 and the corresponding liner 320. In some embodiments, the conductive features 601, the barrier layers 318, and the liners 320 include a material having high carbon solubility, and the carbon-containing layers 606 are formed between each barrier layers 318 and the dielectric layer 314.

As described above, the carbon-containing layer 606 is formed by having carbon species diffuse through materials having high carbon solubility. In some embodiments, the carbon-containing layer 606 is formed on the dielectric layer 314, the barrier 318, or the liner 320 by any suitable process. For example, the carbon-containing layer 606 may be deposited on the barrier layer 318 prior to the formation of the liner 320 and the conductive feature 601, and the liner 320 is formed on the carbon-containing layer 606. In other words, the carbon-containing layer 606 is formed on a material instead of formed by diffusing carbon species through materials having high carbon solubility.

Figure 6E:
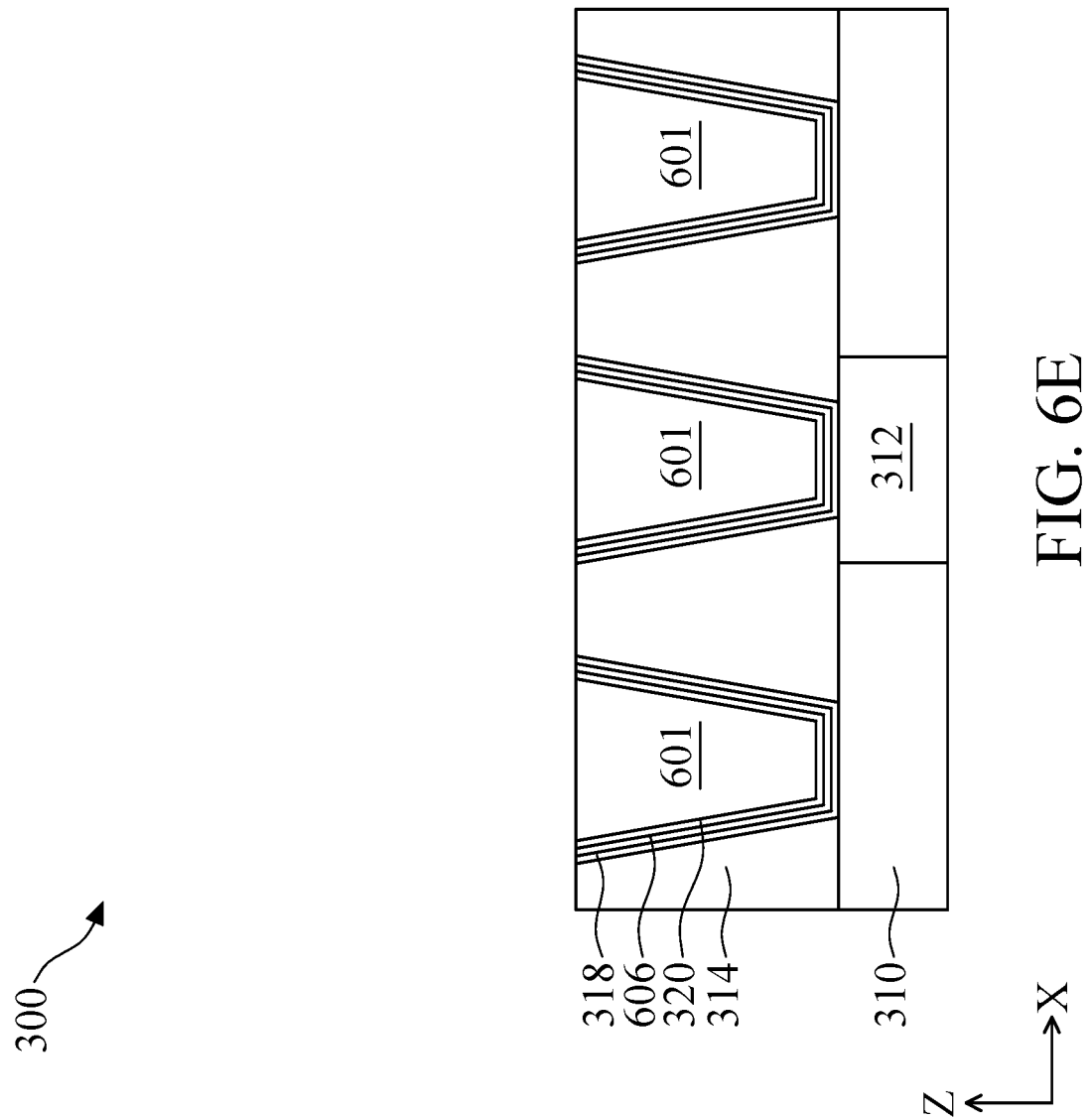
Figure 6F:
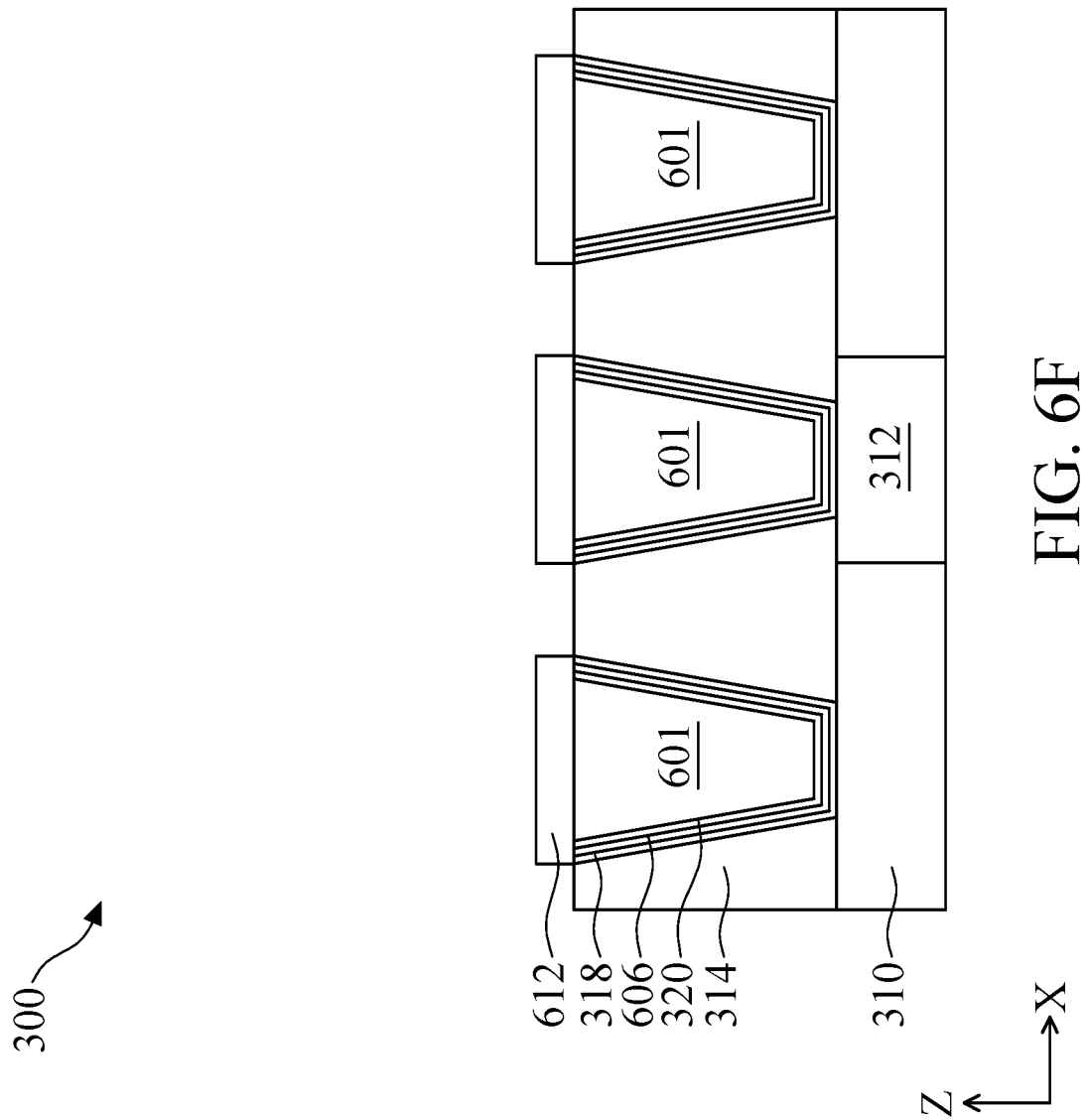

As shown in FIG. 6E, the carbon-containing layers 602 are removed. The carbon-containing layers 602 may be removed by any suitable process. In some embodiments, the carbon-containing layers 602 are removed by a plasma process that does not substantially affect the dielectric layer 314, the barrier layers 318, the liners 320, and the conductive features 601. The carbon-containing layers 606 formed between the barrier layer 318 and the liner 320 are substantially unaffected due to the small dimensions of the exposed portion of the carbon-containing layer 606. In some embodiments, after the removal of the carbon-containing layers 606, processes described in FIGS. 3D and 4B may be performed. For example, the etch stop layer 330 is formed on the dielectric layer 314 and the conductive features 601, the dielectric layer 332 is formed on the etch stop layer 330, and the conductive feature 334 is formed in the dielectric layer 332. The conductive feature 334 may be in contact with the conductive feature 601. The carbon-containing layers 606 may reduce electrical resistivity of the conductive features 601.

In some embodiments, after the removal of the carbon-containing layers 602, metal layers 612 are selectively formed on the conductive features 601. In some embodiments, the metal layers 612 are also formed on the barrier layers 318, the carbon-containing layers 606 and the liners 320. The metal layers 612 may include the same material as the metal layers 336 (FIG. 5C) and may be formed by the same process as the metal layers 336. In some embodiments, after forming the metal layers 612, processes described in FIGS. 3D and 3E or 4B may be performed. For example, the etch stop layer 330 is formed on the metal layers 612 and the dielectric layer 314, the dielectric layer 332 is formed on the etch stop layer 330, and the conductive feature 334 is formed in the dielectric layer 332. The conductive feature 334 may be in contact with the metal layer 612 or the conductive feature 601.

Figure 7:
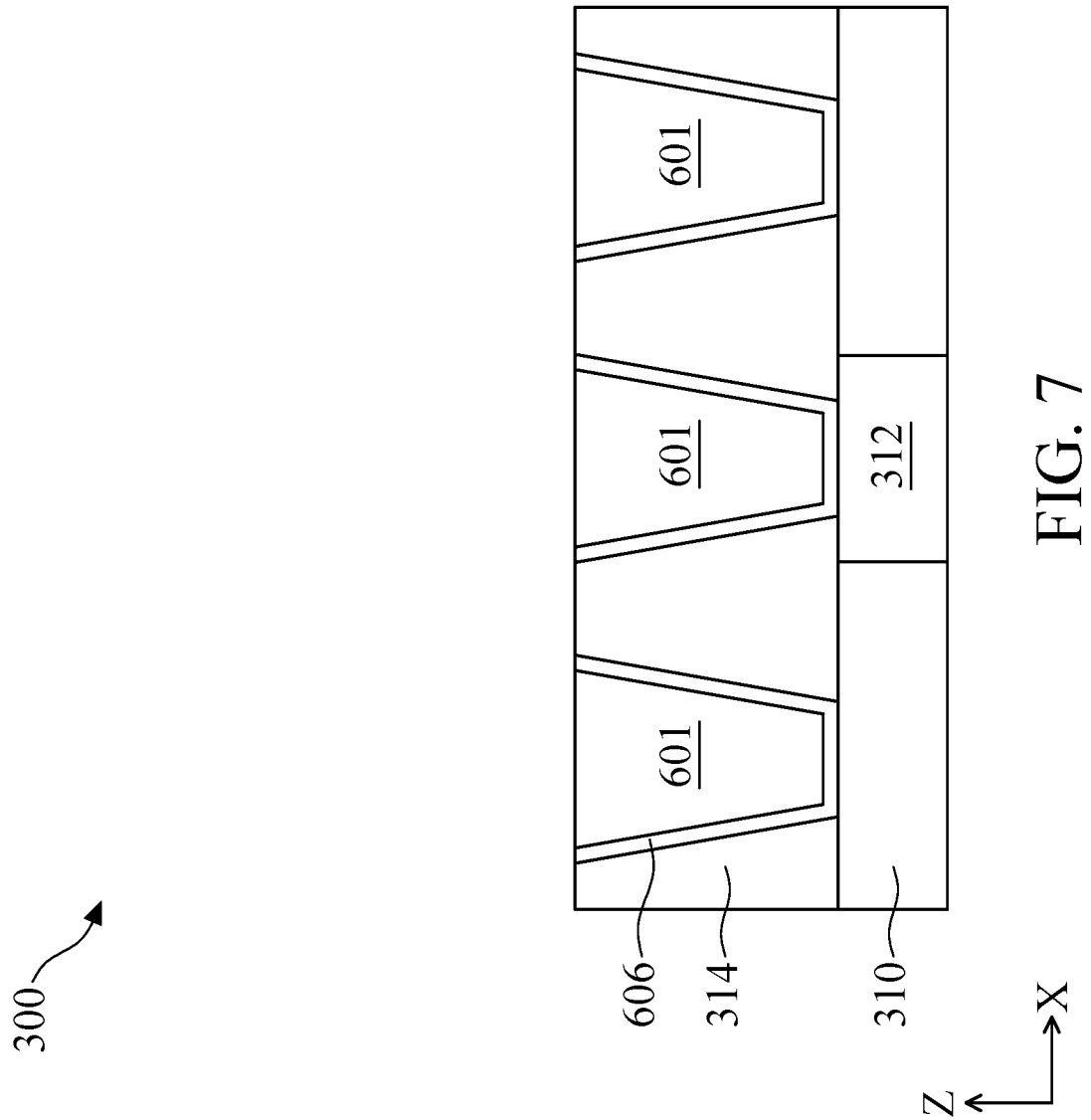
FIG. 7 is a cross-sectional side view of one of various stages of manufacturing the interconnect structure, in accordance with alternative embodiments.

FIG. 7 is a cross-sectional side view of one of various stages of manufacturing the interconnect structure 300, in accordance with alternative embodiments. As shown in FIG. 7, the conductive features 601 includes a material not susceptible to metal diffusion, and the barrier layers 318 and the liners 320 are not present. In some embodiments, the conductive features 601 includes Co. The carbon-containing layers 602 (FIG. 6B) may be formed, and the carbon species diffuse through the conductive features 601. As a result, the carbon-containing layers 606 are formed between the dielectric layer 314 and the conductive features 601 to help decrease the electrical resistivity of the conductive features 601. The carbon-containing layer 606 includes the metal of the conductive feature 601. The etch stop layer 330, the dielectric layer 332, and the conductive feature 334 may be formed over the dielectric layer 314, the conductive features 601, and the carbon-containing layers 606. In some embodiments, the metal layers 612 are formed on the conductive features 601 and the carbon-containing layers 606, and the conductive feature 334 may be formed on the metal layer 612 or the conductive feature 601.

The conductive features 316, 601 shown in FIGS. 3A-3E and 6A-6F are shown as features formed by a single damascene process. In some embodiments, the conductive features 316, 601 are formed by a dual damascene process, and each conductive feature 316, 601 includes a line portion and a via portion. The line portion may be disposed over the via portion. In some embodiments, the carbon-containing layer 606 is formed around both the line and via portions. In some embodiments, the carbon-containing layers 324, 606 are formed in the interconnect structure 300 by diffusing carbon atoms through a metal. Similar process may be utilized to form carbon-containing layers, such as layers of graphene, in front-end-of-the-line (FEOL) or middle-of-the-line (MOL) processes.

The present disclosure in various embodiments provides an interconnect structure and methods of forming the same. In some embodiments, the interconnect structure includes a conductive feature 316 disposed in a dielectric layer 314, and a carbon-containing layer 324 is formed on the conductive feature 316. The carbon-containing layer 324 is formed by diffusing through a metal layer 322 formed on the conductive feature 316. Some embodiments may achieve advantages. For example, the metal layer 322 protects the conductive features 316 during the formation of the carbon-containing layers 324. As a result, electrical resistivity of the conductive features 316 is reduced.

An embodiment is an interconnect structure. The structure includes a first dielectric layer and one or more first conductive features disposed in the first dielectric layer. The one or more first conductive features includes a first metal. The structure further includes a plurality of graphene layers disposed on each of the one or more first conductive features, the plurality of graphene layers include a second metal intercalated therebetween, and the second metal is different from the first metal.

Another embodiment is an interconnect structure. The structure includes a first dielectric layer, one or more first conductive features disposed in the first dielectric layer, and a carbon-containing layer disposed between each of the one or more first conductive features and the first dielectric layer. The carbon-containing layer includes a slant portion and a horizontal portion connected to the slant portion, the slant portion has a first thickness at a top of the slant portion and a second thickness at a bottom of the slant portion, the horizontal portion has a third thickness, and the first thickness is substantially greater than the second thickness, which is substantially greater than the third thickness.

A further embodiment is a method. The method includes forming one or more first conductive features in a first dielectric layer, forming a first metal layer on each of the one or more first conductive features, forming a carbon-containing layer between each first metal layer and each first conductive feature, forming an etch stop layer over the carbon-containing layer, forming a second dielectric layer on the etch stop layer and forming a second conductive feature in the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming one or more first conductive features in a first dielectric layer;
    forming a first metal layer on each of the one or more first conductive features; then
    forming a carbon-containing layer between each first metal layer and each first conductive feature;
    removing the first metal layer; then
    forming an etch stop layer over the carbon-containing layer;
    forming a second dielectric layer on the etch stop layer; and
    forming a second conductive feature in the second dielectric layer.

2. The method of claim 1, further comprising selectively forming a second metal layer on the carbon-containing layer before forming the etch stop layer.

3. The method of claim 1, wherein the forming of the carbon-containing layer comprises a plasma assisted process, and the first metal layer is selectively formed on each of the one or more first conductive features.

4. The method of claim 3, wherein a processing temperature of the plasma assisted process ranges from about 0 degrees Celsius to about 450 degrees Celsius.

5. The method of claim 4, wherein a processing pressure of the plasma assisted process ranges from about 1 Torr to about 4000 Torr.

6. The method of claim 1, wherein the carbon-containing layer comprises 1 to 1000 layers of graphene.

7. A method, comprising:
    forming a first conductive feature in a first dielectric layer;

depositing a first metal layer on the first conductive feature, wherein a carbon solubility of the first metal layer is substantially greater than a carbon solubility of the first conductive feature;

performing a process to diffuse carbon-containing species through the first metal layer to form a carbon-containing layer between the first metal layer and the first conductive feature; and removing the first metal layer to expose the carbon-containing layer.

8. The method of claim 7, wherein the process is a plasma assisted process.

9. The method of claim 7, wherein the first metal layer comprises Ni, Co, W, Mo, or Ru, and the first conductive feature comprises Cu.

10. The method of claim 7, wherein the first metal layer is selectively deposited on the first conductive feature.

11. The method of claim 7, further comprising depositing an etch stop layer on the carbon-containing layer and the first dielectric layer.

12. The method of claim 11, further comprising depositing a second dielectric layer on the etch stop layer.

13. The method of claim 12, further comprising forming a second conductive feature through the second dielectric layer and the etch stop layer.

14. The method of claim 13, wherein the second conductive feature is in contact with the first conductive feature.

15. A method, comprising:
forming an opening in a dielectric layer;
depositing a barrier layer in the opening;
depositing a liner on the barrier layer;
depositing a conductive feature on the liner, wherein a top surface of the conductive feature and a top surface of the dielectric layer are substantially coplanar; and
forming a carbon-containing layer between the dielectric layer and the conductive feature, wherein the carbon-containing layer is formed between the barrier layer and the liner.

16. The method of claim 15, further comprising forming the carbon-containing layer on the conductive feature.

17. The method of claim 16, further comprising removing the carbon-containing layer formed on the conductive feature and depositing a metal layer on the conductive feature.

18. The method of claim 15, wherein the barrier layer comprises a metal or a metal nitride.

19. The method of claim 18, wherein the liner comprises a metal.

20. The method of claim 19, wherein the carbon-containing layer is formed by diffusing carbon-containing species through the liner.

* * * * *